(12) United States Patent
Dimino et al.

(10) Patent No.: US 8,401,822 B2
(45) Date of Patent: Mar. 19, 2013

(54) SYSTEM, WELLNESS CIRCUIT AND METHOD OF DETERMINING WELLNESS OF A ROTATING ELECTRICAL APPARATUS

(75) Inventors: Steven A. Dimino, Wauwatosa, WI (US); Ting Yan, Brookfield, WI (US); Mark A. Verheyen, Whitefish Bay, WI (US); Thomas M. Ruchti, Pewaukee, WI (US)

(73) Assignee: Eaton Corporation, Cleveland, OH (US)

( * ) Notice: Subject to any disclaimer, the term of this patent is extended or adjusted under 35 U.S.C. 154(b) by 248 days.

(21) Appl. No.: 12/763,761

(22) Filed: Apr. 20, 2010

(65) Prior Publication Data

US 2011/0257934 A1    Oct. 20, 2011

(51) Int. Cl.
*G07C 3/00* (2006.01)
*H02H 3/04* (2006.01)
*G01R 31/34* (2006.01)

(52) U.S. Cl. ........ 702/183; 702/185; 702/188; 340/664; 324/765.01

(58) Field of Classification Search .................. 702/183, 702/185; 340/664; 324/765.01
See application file for complete search history.

(56) References Cited

U.S. PATENT DOCUMENTS

| | | | |
|---|---|---|---|
| 5,461,329 A | 10/1995 | Linehan et al. | |
| 5,485,491 A | 1/1996 | Salnick et al. | |
| 5,550,879 A | 8/1996 | Hershey | |
| 5,550,880 A | 8/1996 | Abdel-Malek et al. | |
| 5,578,937 A | 11/1996 | Haynes et al. | |
| 5,629,870 A | 5/1997 | Farag et al. | |
| 5,917,428 A | 6/1999 | Discenzo et al. | |
| 7,075,327 B2 | 7/2006 | Dimino et al. | |
| 7,117,125 B2 | 10/2006 | Dimino et al. | |
| 7,231,319 B2 | 6/2007 | Dimino et al. | |
| 7,336,455 B2 | 2/2008 | Dimino et al. | |
| 7,346,475 B2* | 3/2008 | Dimino et al. ................ | 702/185 |
| 2007/0073521 A1* | 3/2007 | Carle et al. .................... | 702/188 |
| 2009/0146599 A1 | 6/2009 | Zhou et al. | |
| 2011/0241888 A1* | 10/2011 | Lu et al. ....................... | 340/626 |

OTHER PUBLICATIONS

Zhou, W., et al., "Bearing Fault Detection Via Stator Current Noise Cancellation and Statistical Control", IEEE Transactions on Industrial Electronics, vol. 55, No. 12, Dec. 2008, pp. 4260-4269.

(Continued)

*Primary Examiner* — Jonathan C Teixeira Moffat
*Assistant Examiner* — Regis Betsch
(74) *Attorney, Agent, or Firm* — Eckert Seamans Cherin & Mellott, LLC; Kirk D. Houser

(57) ABSTRACT

A wellness circuit is for a rotating electrical apparatus having a rated current and being operatively associated with an electrical switching, control, protection or monitoring apparatus structured to provide a number of currents and a number of voltages of the rotating electrical apparatus. The wellness circuit includes a current sensor scaled to the rated current and structured to provide a notch current signal representative of one of the number of currents; an interface to the electrical switching, control, protection or monitoring apparatus, the interface providing the number of currents and the number of voltages; and a processor employing the number of currents and the number of voltages from the interface and the notch current signal to determine wellness of the rotating electrical apparatus. The wellness circuit is structured to be separate from or added to the electrical switching, control, protection or monitoring apparatus.

21 Claims, 4 Drawing Sheets

OTHER PUBLICATIONS

Ferdjallah, M., et al., "Adaptive Digital Notch Filter Design on the Unit Circle for the Removal of Powerline Noise from Biomedical Signals", IEEE Transactions on Biomedical Engineering, vol. 41, No. 6, Jun. 1994, pp. 529-536.

European Patent Office, "International search report and Written Opinion", Sep. 22, 2011, 13 pp.

* cited by examiner

SYSTEM, WELLNESS CIRCUIT AND METHOD OF DETERMINING WELLNESS OF A ROTATING ELECTRICAL APPARATUS

BACKGROUND

1. Field

The disclosed concept pertains generally to rotating electrical apparatus and, more particularly, to systems for determining wellness of a rotating electrical apparatus, such as a motor. The disclosed concept also pertains to wellness circuits for rotating electrical apparatus. The disclosed concept further pertains to methods of determining wellness of a rotating electrical apparatus, such as a motor.

2. Background Information

Three-phase induction motors consume a large percentage of generated electricity capacity. Many applications for this "workhorse" of industry are fan and pump industrial applications. For example, in a typical integrated paper mill, low voltage and medium voltage motors may comprise nearly 70% of all driven electrical loads. Due to the prevalence of these motors in industry, it is paramount that the three-phase motor be reliable. Industry reliability surveys suggest that motor failures typically fall into one of four major categories. Specifically, motor faults typically result from bearing failure, stator turn faults, rotor bar failure, or other general faults/failures. Within these four categories: bearing, stator, and rotor failures account for approximately 85% of all motor failures.

It is believed that this percentage could be significantly reduced if the driven equipment were better aligned when installed, and remained aligned regardless of changes in operating conditions. However, motors are often coupled to misaligned pump loads or loads with rotational unbalance and fail prematurely due to stresses imparted upon the motor bearings. Furthermore, manually detecting such fault causing conditions is difficult at best because doing so requires the motor to be running. As such, an operator is usually required to remove the motor from operation to perform a maintenance review and diagnosis. However, removing the motor from service is undesirable in many applications because motor down-time can be extremely costly.

As such, some detection devices have been designed that generate feedback regarding an operating motor. The feedback is then reviewed by an operator to determine the operating conditions of the motor. However, most systems that monitor operating motors merely provide feedback of faults that have likely already damaged the motor. As such, although operational feedback is sent to the operator, it is usually too late for preventive action to be taken.

Some systems have attempted to provide an operator with early fault warning feedback. For example, vibration monitoring has been utilized to provide some early misalignment or unbalance-based faults. However, when a mechanical resonance occurs, machine vibrations are amplified. Due to this amplification, false positives indicating severe mechanical asymmetry are possible. Furthermore, vibration based monitoring systems typically require highly invasive and specialized monitoring systems to be deployed within the motor system.

In light of the drawbacks of vibration based monitoring, current-based monitoring techniques have been developed to provide a relatively more inexpensive, non-intrusive technique for detecting bearing faults.

It is known to employ motor current signature analysis to detect various motor faults. See, for example, U.S. Pat. No. 5,629,870.

Known products employing motor current signature analysis technology have a definite purpose (i.e., motor wellness) and a relatively high cost as compared to typical motor protection devices, such as electronic overloads.

U.S. Patent Application Publication No. 2009/0146599 discloses the detection of abnormal conditions to predictively determine potential motor faults. Current signature analysis (CSA) is utilized to review raw data received from a plurality of sensors of a controller monitoring an operating motor. The system, which is preferably disposed within the controller, decomposes the sensed/monitored current into a non-fault component and a fault component, and performs a noise-cancellation operation to isolate the fault component of the current and generate a fault identifier. An operator of the monitored motor system is then proactively alerted of a potential fault prior to a fault occurrence. A notch filter, a low pass filter and an analog-to-digital (A/D) convertor operate to receive raw data generated by current sensors and prepare the raw data for processing by a processor. The filters are used to eliminate the fundamental frequency (e.g., 60 Hz in US and 50 Hz in Asia) and low frequency harmonics, as these harmonic contents are not related to bearing failure. Removing such frequencies (especially the base frequency component) from the measured current data can greatly improve the A/D conversion resolution and signal-to-noise ratio (SNR), as the 60 Hz frequency has a large magnitude in the frequency spectrum of the current signal.

It is known to employ a high-pass filter, a band-pass filter, or a notch filter prior to demodulation to increase sensitivity to motor frequency components and decrease sensitivity to mechanical components (e.g., gear meshing; belt turning).

It is believed that no existing product or solution provides a cost effective and well defined way to add a motor wellness function to a base product, such as, for example, a three-phase switching, control, protection or monitoring device.

There is room for improvement in systems for determining wellness of a rotating electrical apparatus, such as a motor.

There is also room for improvement in methods of determining wellness of a rotating electrical apparatus, such as a motor.

SUMMARY

These needs and others are met by embodiments of the disclosed concept, which enable a wellness circuit for a rotating electrical apparatus, such as for instance a motor, to be added to an electrical switching, control, protection or monitoring apparatus. For example, as a result, a user can add a wellness circuit to a number of high value motors, but still have a cost effective and consistent solution for other motors.

In accordance with one aspect of the disclosed concept, a system for determining wellness of a rotating electrical apparatus having a rated current comprises: an electrical switching, control, protection or monitoring apparatus operatively associated with the rotating electrical apparatus and being structured to provide a number of currents and a number of voltages thereof; and a wellness circuit for the rotating electrical apparatus, the wellness circuit being separate from or added to the electrical switching, control, protection or monitoring apparatus, the wellness circuit comprising: a current sensor scaled to the rated current and structured to provide a notch current signal representative of one of the number of currents, an interface to the electrical switching, control, protection or monitoring apparatus, the interface providing the number of currents and the number of voltages, and a processor employing the number of currents and the number of voltages from the interface and the notch current signal to determine wellness of the rotating electrical apparatus.

The external interfaces of the wellness circuit may be limited to the current sensor and the interface to the electrical switching, control, protection or monitoring apparatus.

The wellness circuit may be structured to operate with a plurality of different types of the electrical switching, control, protection or monitoring apparatus.

As another aspect of the disclosed concept, a wellness circuit is for a rotating electrical apparatus operatively associated with an electrical switching, control, protection or monitoring apparatus structured to provide a number of currents and a number of voltages of the rotating electrical apparatus. The rotating electrical apparatus has a rated current. The wellness circuit comprises: a current sensor scaled to the rated current and structured to provide a notch current signal representative of one of the number of currents; an interface to the electrical switching, control, protection or monitoring apparatus, the interface providing the number of currents and the number of voltages; and a processor employing the number of currents and the number of voltages from the interface and the notch current signal to determine wellness of the rotating electrical apparatus, wherein the wellness circuit is structured to be separate from or added to the electrical switching, control, protection or monitoring apparatus.

As another aspect of the disclosed concept, a wellness system comprises: a rotating electrical apparatus having a rated current; an electrical switching, control, protection or monitoring apparatus operatively associated with the rotating electrical apparatus and being structured to provide a number of currents and a number of voltages thereof; and a wellness circuit for the rotating electrical apparatus, the wellness circuit being separate from or added to the electrical switching, control, protection or monitoring apparatus, the wellness circuit comprising: a current sensor scaled to the rated current and structured to provide a notch current signal representative of one of the number of currents, an interface to the electrical switching, control, protection or monitoring apparatus, the interface providing the number of currents and the number of voltages, and a processor employing the number of currents and the number of voltages from the interface and the notch current signal to determine wellness of the rotating electrical apparatus.

As another aspect of the disclosed concept, a method of determining wellness of a rotating electrical apparatus having a rated current comprises: operatively associating an electrical switching, control, protection or monitoring apparatus with the rotating electrical apparatus; providing a number of currents and a number of voltages of the rotating electrical apparatus with the electrical switching, control, protection or monitoring apparatus; providing a wellness circuit for the rotating electrical apparatus; providing the wellness circuit separate from or added to the electrical switching, control, protection or monitoring apparatus; providing a notch current signal representative of one of the number of currents with a current sensor scaled to the rated current; interfacing the electrical switching, control, protection or monitoring apparatus to the wellness circuit to provide the number of currents and the number of voltages thereto; and processing the number of currents and the number of voltages and the notch current signal to determine wellness of the rotating electrical apparatus.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
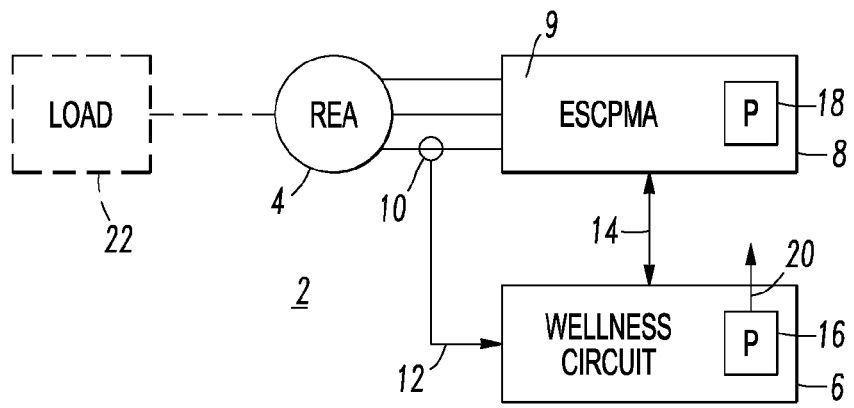
FIG. 1 is a block diagram in schematic form of a wellness system including a three-phase rotating electrical apparatus and a three-phase wellness circuit added to a base three-phase electrical switching apparatus in accordance with embodiments of the disclosed concept.

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; a digital signal processor (DSP); an application-specific integrated circuit (ASIC); or any suitable processing device or apparatus.

As employed herein, the term "wellness" shall mean the quality or state of being in a desired, intended or normal range of operating conditions of a rotating electrical apparatus, or anything detracting from such desired, intended or normal range operating conditions.

As employed herein, the term "low voltage" shall mean any voltage greater than about 100 $V_{RMS}$ and less than about 600 $V_{RMS}$.

As employed herein, the term "medium voltage" shall mean any voltage greater than a low voltage and in the range from about 600 $V_{RMS}$ to about 52 $kV_{RMS}$.

As employed herein, the term "controller" means the combination of a contactor and a protective relay, a variable frequency drive, or a soft starter.

As employed herein, the terms "protection relay" or "protective relay" can include, for example and without limitation, a number of current and/or voltage sensors, a processor, and a control circuit to open and close a contactor. The relay and/or current and/or voltage sensors can be part of or be separate from a contactor.

As employed herein, the term "contactor" includes, for example and without limitation, a low voltage contactor; a medium voltage contactor; or an electrically operated low or medium voltage circuit breaker. A contactor can include, for example and without limitation, a number of separable contacts and an operating mechanism.

As employed herein, the term "rotating electrical apparatus" means a motor, a motor and a load (e.g., without limitation, a pump), or a generator.

As employed herein, a "high resolution current sensor" is suitably or closely scaled to the rated current of a rotating electrical apparatus, such as for instance a motor. In typical motor protection and/or control devices, current sensors are scaled to enable the device to monitor fault currents that are about 6 to about 20 times the rated current. The current signals acquired by these systems do not have the required level of fidelity to perform current signature analysis since the fault signatures can be less than about one percent of the rated current.

As employed herein, a "notch current signal" is a motor current signal that has its fundamental component removed prior to analog gain and analog-to-digital operation. The purpose of a notch filter is to increase the resolution of the current signature analysis fault signatures of interest.

The disclosed concept is described in association with a three-phase electrical switching apparatus and a three-phase rotating electrical apparatus, such as a three-phase induction motor, although the disclosed concept is applicable to a wide range of electrical switching, control, protection or monitoring apparatus and rotating electrical apparatus having any number of poles or phases. For example and without limitation, data passing between a base product and a wellness module can be measured or estimated for a single-phase application.

Referring to FIG. 1, a wellness system 2 includes a three-phase rotating electrical apparatus (REA), such as the example motor 4, a three-phase wellness circuit 6, and a base three-phase electrical switching, control, protection or monitoring apparatus (ESCPMA), such as the example electrical switching apparatus 8. The wellness system 2 determines wellness of the rotating electrical apparatus 4. The electrical switching apparatus 8 is operatively associated with the rotating electrical apparatus 4 (e.g., without limitation, structured to interrupt the power circuit thereto) and is structured to provide a number (e.g., without limitation, three) of currents and a number (e.g., without limitation, three) of voltages 9 thereof.

The wellness circuit 6 is for the motor 4, and is separate from or added to the electrical switching apparatus 8. The wellness circuit 6 includes a current transducer, such as the example high resolution current sensor 10 (e.g., without limitation, a current transformer (CT), a Hall effect sensor or another suitable type of current sensor) structured to provide a notch current signal 12 representative of one of the number of currents, and an interface 14 to the electrical switching apparatus 8. The interface 14 provides the number of currents and the number of voltages 9. The wellness circuit 6 also includes a processor (P) 16 employing the number of currents and the number of voltages 9 from the interface 14 and the notch current signal 12 to determine wellness of the motor 4. The example data to the wellness circuit 6 (from the example electrical switching apparatus 8) includes three-phase RMS voltage, three-phase RMS current, percent load, frequency, motor name plate data, and user configuration data (e.g., fault thresholds). The wellness circuit 6 has direct access to the notch current signal 12 for current signature analysis.

EXAMPLE 1

The electrical switching, control, protection or monitoring apparatus 8 can be selected from the group consisting of a circuit interrupter, a motor starter, a controller, a motor controller, a reduced voltage starter, an inverter drive, a protection device, a relay, a motor protector, an overload relay, and a monitoring device.

EXAMPLE 2

The electrical switching, control, protection or monitoring apparatus 8 includes a processor (P) 18. The interface 14 is between the processor 18 and the processor 16 of the wellness circuit 6.

EXAMPLE 3

The interface 14 can be a Serial Peripheral Interface (SPI) bus interface. Alternatively, the interface 14 can be any standard bus supported by the processor 18 (e.g., without limitation, CAN, I²C, RS-485, RS-232, RS-422, or any suitable known or proprietary communication network).

EXAMPLE 4

The processor 16 of the wellness circuit 6 can be a digital signal processor.

EXAMPLE 5

The rotating electrical apparatus can be a three-phase motor 4. The interface 14 can be structured to provide to the processor 16 of the wellness circuit 6 a number of motor name plate data (e.g., without limitation, rated voltage; full load amperes; rated efficiency; rated speed; rated power factor provided by the motor manufacturer), per phase current, per phase voltage, percent load (e.g., without limitation, measured by the electrical switching, control, protection or monitoring apparatus 8 in percent of full load kilowatts), Ids and Idq (e.g., estimated current dqs vectors), Vds and Vdq (e.g., estimated voltage dqs vectors), frequency, and user fault settings (e.g., without limitation, threshold or other parameters that the user can modify to change the sensitivity of wellness fault detection). The dq transformation is a transformation of coordinates from a three-phase stationary coordinate system to the dq rotating coordinate system. Use of the dq rotating coordinate system can greatly simplify the mathematical modeling and analysis of motor static and dynamic behavior.

EXAMPLE 6

The processor 16 of the wellness circuit 6 can include an output 20 structured to provide a number of alarms or warnings (e.g., without limitation, detection of rotational faults, bearing faults, stator faults, rotor faults in the motor, faults in the load), cavitation data (e.g., without limitation, a cavitation fault index; a measurement of the severity of the fault condition), motor fault data (e.g., without limitation, a misalignment fault index; a measurement of the severity of the fault condition), bearing fault data (e.g., without limitation, bearing fault index; a measurement of the severity of the fault condition), compressed spectrum (e.g., without limitation, various wellness algorithms are based on frequency spectrum analysis; a representation of a frequency spectrum can be suitable displayed at a user display; preferably, the amount of data is limited), frequency, and notch status (e.g., without limitation, feedback to the electrical switching, control, protection or monitoring apparatus 8 to indicate that the wellness circuit 6 is properly collecting the desired data).

EXAMPLE 7

Further to Example 6, the number of alarms can be selected from the group consisting of a number of faults of the motor 4, a number of rotational faults of the motor 4, a number of bearing faults of the motor 4, a number of stator faults of the motor 4, a number of rotor faults of the motor 4, and a number of faults in a load (e.g., without limitation, a pump 22) coupled to the motor 4.

EXAMPLE 8

A low voltage or a medium voltage is provided to the rotating electrical apparatus 4 by the electrical switching apparatus 8. The interface 14 is structured to operate at a logic level voltage, which is substantially smaller than the low voltage or the medium voltage.

EXAMPLE 9

The external interfaces of the wellness circuit 6 can be limited to the high resolution current sensor 10 and the interface 14 to the electrical switching apparatus 8.

EXAMPLE 10

The wellness circuit 6 can be structured to operate with a plurality of different types of electrical switching, control, protection or monitoring apparatus.

EXAMPLE 11

The wellness circuit 6 can be disposed internal to the electrical switching apparatus 8.

EXAMPLE 12

The wellness circuit 6 can be disposed external to the electrical switching apparatus 8.

EXAMPLE 13

The processor 16 of the wellness circuit 6 can be structured to detect a number of faults of the motor 4.

EXAMPLE 14

Further to Example 13, the number of faults can be selected from the group consisting of a number of faults of the motor 4, a number of rotational faults of the motor 4, a number of bearing faults of the motor 4, a number of stator faults of the motor 4, a number of rotor faults of the motor 4, and a number of faults in a load (e.g., without limitation, the pump 22) coupled to the motor 4.

EXAMPLE 15

Further to Example 13, the interface 14 can be structured to output the detected number of faults to the electrical switching apparatus 8.

EXAMPLE 16

The electrical switching, control, protection or monitoring apparatus 8 can be a three-phase apparatus. The rotating electrical apparatus can be a three-phase motor 4. The number of currents and the number of voltages 9 of the three-phase motor 4 can be three currents and three voltages, respectively, of the three-phase motor 4.

EXAMPLE 17

Figure 2:
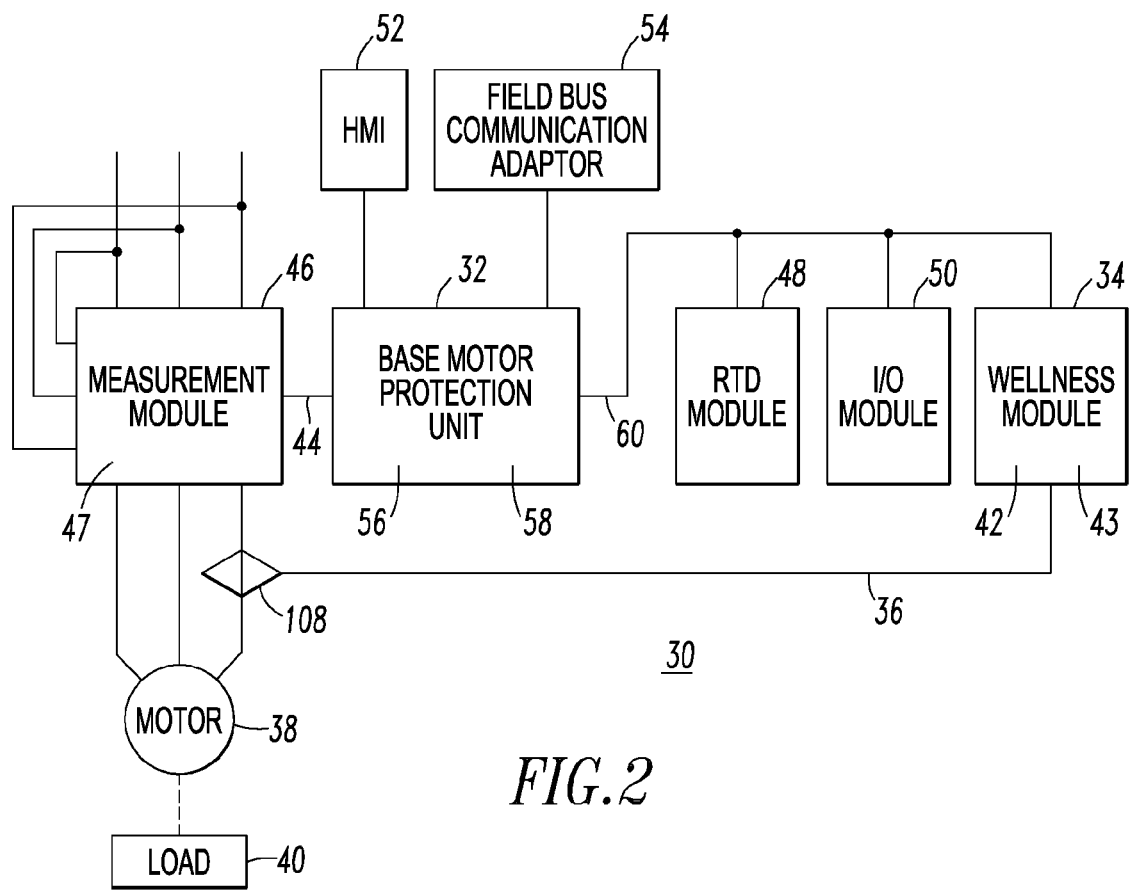
FIG. 2 is a block diagram in schematic form of a modular motor protection system including a motor wellness module added to a base three-phase motor protection unit in accordance with an embodiment of the disclosed concept.

FIG. 2 shows an example modular motor protection system 30 that enables expansion of a relatively low cost (i.e., with respect to typical motor protection devices) base motor protection unit 32 with relatively very cost efficient motor wellness capabilities (e.g., without limitation, diagnostics; prognostics). A motor wellness circuit, such as the example motor wellness module 34, is added to a base three-phase apparatus (e.g., without limitation, a circuit interrupter, a motor starter, a controller, a motor controller, a reduced voltage starter, an inverter drive, a protection device, a relay, a motor protector, an overload relay, a monitoring device, the example base motor protection unit 32). The motor wellness module 34 employs data that is normally available in a relatively low cost, three-phase apparatus. Based upon this data, as well as one additional high resolution notch current signal 36, the motor wellness module 34 processes the data to detect, for example and without limitation, rotational faults, bearing faults, stator faults and rotor faults in the example three-phase motor 38. In addition, the motor wellness module 34 can also detect faults in a load 40 coupled to the motor 38 by employing a variety of algorithms 42 executed by a digital signal processor (DSP) 43 of the motor wellness module 34.

The example base motor protection unit 32 can include or be operatively associated with (e.g., without limitation, through a sensor bus 44) a measurement module 46 having voltage and current transducers 47. The example sensor bus 44 can contain analog and/or digital signals depending whether the measurement module 46 contains signal sampling electronic components (not shown). The example signal resolution for the current measurements can be relatively low due to an example dynamic range of eight times the rated current for the base motor protection unit 32. For example, the measurement module 46 can be separate from the base motor protection unit 32 or could, alternatively, be integrated into the base motor protection unit 32 (e.g., without limitation, a motor starter; a circuit breaker).

The example base motor protection unit 32 provides overload protection and power monitoring. Local I/O (e.g., without limitation, I/O module 50) available on or with the base motor protection unit 32 can be used to trip the motor 38 OFF in the presence of a fault condition. The base motor protection unit 32 can be connected to a remote display, such as the example Human-Machine Interface (HMI) 52 (e.g., without limitation, a liquid crystal display screen) and/or to a field bus network (not shown) through an example field bus communication adapter 54. The HMI 52 and the communication adapter 54 can be connected to the base motor protection unit 32 by RS-485 or any other suitable physical layer, protocol or interface.

The example base motor protection unit power monitoring function 56 (FIG. 3) can provide the following measured/estimated data: per phase RMS voltages and currents; Idqs, Vdqs (vector quantities); power monitoring (e.g., watts, vars, VA, power factor); frequency; thermal capacity remaining; current and voltage unbalance; and RMS ground current (residual and/or zero sequence if available).

The base motor protection unit motor protection function 58 (FIG. 3) can include: thermal overload; instantaneous over current; current imbalance; low/high load (kW); voltage imbalance; under/over voltage; phase sequence; frequency deviation; power factor; residual ground fault; and zero-sequence ground fault CT input.

The base motor protection unit 32 measures the data described above from three-phase motor currents and voltages from the measurement module 46. These measurements as well as any user configuration are sent to the wellness module 34 via an SPI bus 60 (or another suitable physical layer) using a suitable protocol. The wellness module 34 uses these measurements along with motor current signature analysis on the high resolution notch current signal 36 to determine wellness (e.g., without limitation, health) of the motor 38 and/or the load 40. The wellness information can then be collected by the base motor protection unit 32 over the same SPI bus 60.

Figure 4:
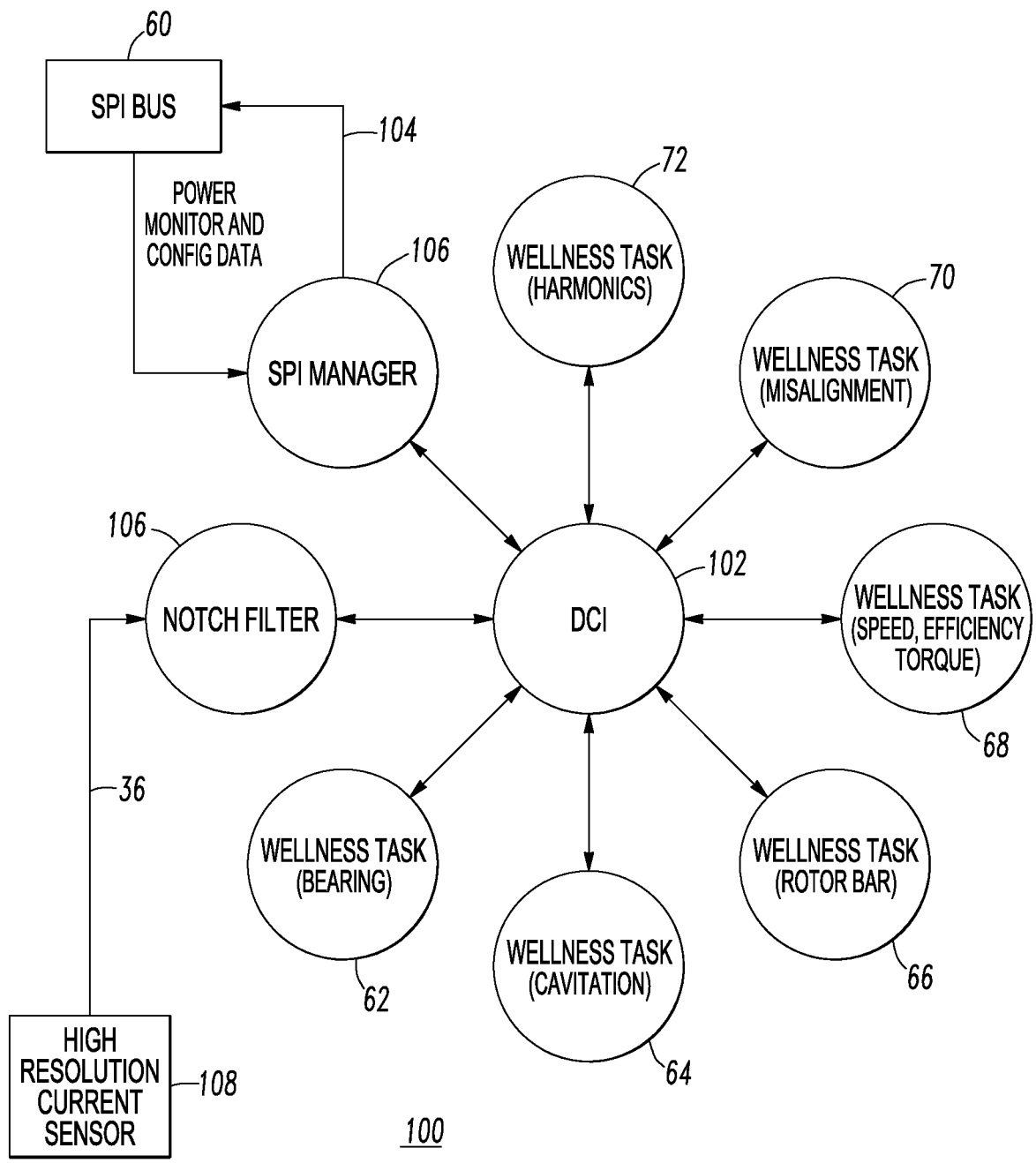
FIG. 4 is a data flow diagram for the motor wellness module of FIG. 2.

The wellness module 34 uses power monitoring data from the base motor protection unit 32 over the SPI bus 60 as well as samples of the high resolution notch current signal 36 as inputs to a set of example motor diagnostic algorithms 62,64, 66,68,70,72 (FIG. 4). The output of these algorithms can be communicated back to the base motor protection unit 32 via the SPI bus 60. The base motor protection unit 32 can also interface other suitable modules, such as for example and without limitation, the RTD and I/O modules 48,50, via the SPI bus 60.

The example algorithms 62,64,66,68,70,72 (FIG. 4) for motor wellness exclude the need for external sensors (e.g., without limitation, pressure; temperature; vibration; flow) and advantageously employ information available from signal analysis of the three-phase motor current and voltage and the high resolution notch current signal 36. This permits a relatively simple architecture as is disclosed herein. Typically, much data is not desired and, instead, actionable information is preferably provided. To that end, the wellness algorithms 62,64,66,68,70,72 can provide alerts, for example, only when an unhealthy condition is detected. In most cases, such algorithms will not require much configuration from the user to set, for example and without limitation, alert thresholds. The goal is to have algorithms that are primarily dependent on the information available from the motor name plate data.

The wellness module 34 can perform a number of the following example functions: bearing fault detection (see, e.g., U.S. Pat. Appl. Pub. No. 2009/0146599; U.S. Pat. Nos. 7,117,125; 7,075,327); misalignment/rotating unbalance detection (see, e.g., U.S. Pat. Nos. 7,346,475; 7,336,455); pump cavitation or rotor bar failure detection (see, e.g., U.S. Pat. Nos. 7,346,475; 7,336,455; 7,231,319; 7,117,125; 7,075, 327); motor speed (see, e.g., U.S. Pat. No. 7,346,475); current harmonic analysis (see, e.g., U.S. Pat. Nos. 7,117,125; 7,075, 327); stator insulation breakdown; motor torque; and motor efficiency.

EXAMPLE 18

Figure 3:
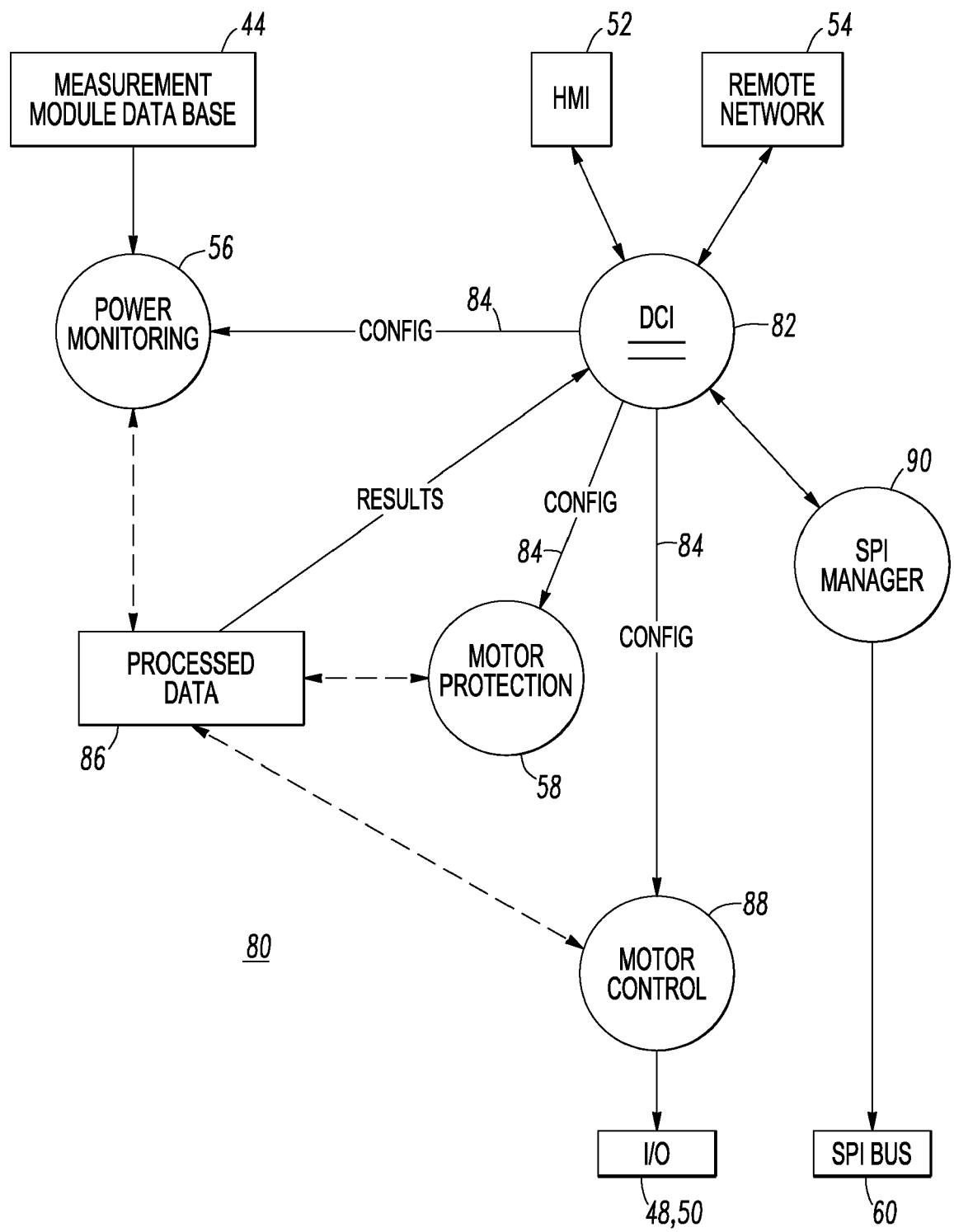
FIG. 3 is a flow diagram for the base three-phase motor protection unit of FIG. 2.

FIG. 3 shows a top level data flow diagram 80 for the base motor protection unit 32. A data center integration (DCI) processing module 82 provides a database of configuration data 84 input from the HMI 52 or remote network 54 and data output 86 by the power monitoring function 56, the motor protection function 58 and a motor control function 88, which trips a contactor (not shown) based on the state of the motor protection. The DCI processing module 82 also communicates with an SPI manager function 90, which communicates with the example SPI bus 60. For example, the DCI processing module 82 manages all customer data, base unit data and wellness unit data, and also manages product default settings and data contained in non-volatile memory (not shown).

EXAMPLE 19

FIG. 4 shows a top level data flow diagram 100 for the wellness module 34. A DCI processing module 102 provides a database of configuration data (not shown) input from the HMI 52 or remote network 54 through the SPI bus 60, and wellness data 104 output by the various wellness algorithms 62,64,66,68,70,72 through the DCI processing module 102, which communicates with an SPI manager function 106, which, in turn, communicates with the example SPI bus 60. The high resolution notch current signal 36 is input by a notch filter function 106 from a high resolution current sensor 108.

EXAMPLE 20

Figure 5:
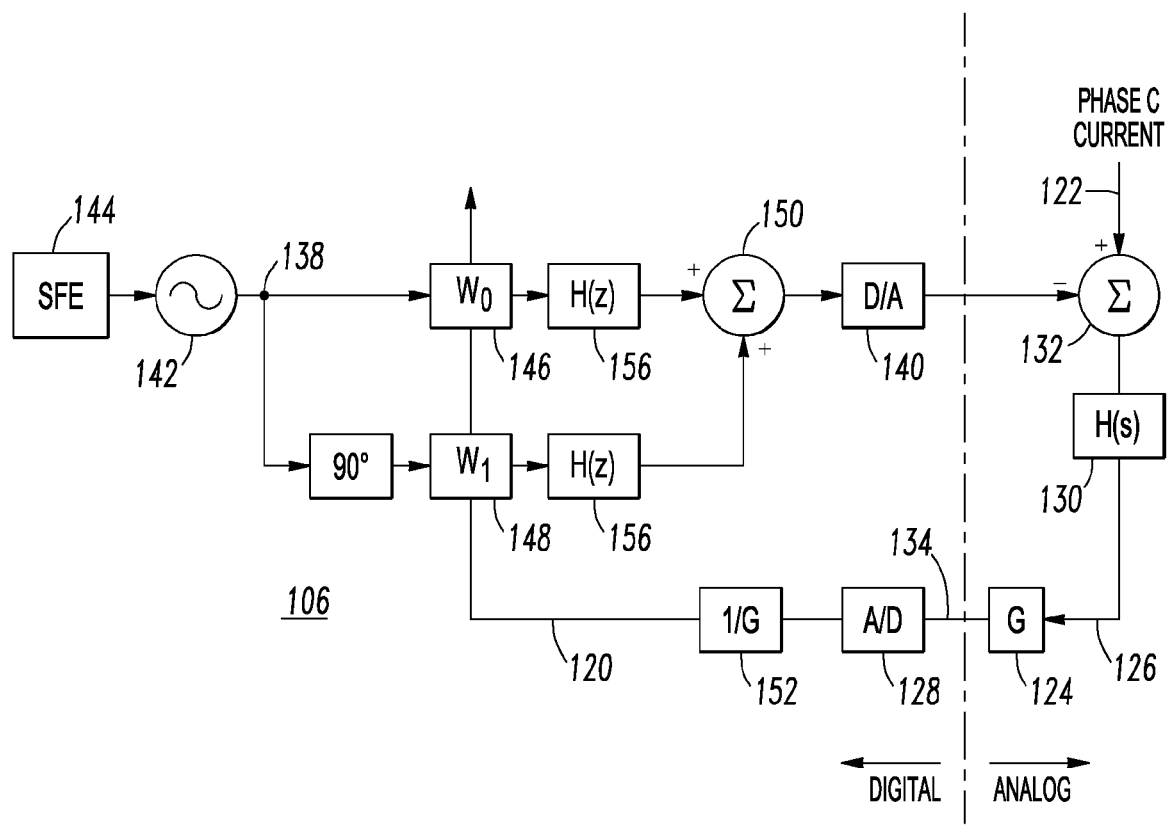
FIG. 5 is a block diagram in schematic form showing the acquisition of a notch current signal employed by motor wellness algorithms of FIG. 4.

FIG. 5 shows the acquisition of a notch current signal 120 by the notch filter 106 (FIG. 4), which notch current signal 120 is used in the various wellness algorithms 62,64,66,68, 70,72 (FIG. 4). The goal of the notch filter 106 is to remove the fundamental frequency component of the phase C current 122 and apply a gain (G) 124 to a residual "notched" signal 126 prior to sampling by analog-to-digital converter (A/D) 128, in order to increase the resolution of the acquired notch current signal 120. The notch filter 106 tracks relatively small variations in the power line frequency for across-the-line loads and can also be used with variable frequency driven loads.

The basic structure of the notch filter 106 is that of an adaptive cancellation filter, however, the direct form of this type of filter cannot be employed because of the existence of the transfer function H(s) 130 between the output of an analog subtraction 132 and the sampled "notched" signal 134. Instead, a filtered-x/u algorithm provided by H(z) 156 is employed to account for the analog transfer function H(s) 130. This digital algorithm filters a reference signal after $W_0$ and $W_1$ with a digital model of H(s) 130 prior to digital-to-analog conversion by digital-to-analog converter (D/A) 140. A delay line model for H(s) assures stability over the desired range of frequencies. In conventional adaptive filters, no H(z) filtering is applied to a reference signal.

The operation of the notch filter 106 is now described. The frequency of a local oscillator 142 is driven by the output of a system frequency estimation (SFE) algorithm 144. Any suitable accurate and stable system frequency estimation technique can be used (e.g., without limitation, zero-crossing detection). The local oscillator 142 is implemented as a look-up table to ensure stability. The terms $W_0$ 146 and $W_1$ 148 are used to direct the magnitude and phase of the local oscillator 142 to identically match that of the phase C current 122. The digital summation at 150 of the filtered reference signal 138 is digital-to-analog converted by the D/A 140 and is subtracted at 132 from the phase C current 122. The adaptively controlled or fixed gain (G) 124 is applied to the residual signal prior to conversion back to digital samples by the A/D 128. The gain (G) 124 is employed since the signals of interest for wellness algorithms (i.e., the wellness cavitation algorithm 64 and the wellness misalignment algorithm 70) can be less than 1% of the magnitude of the fundamental component of the phase C current 122. The "notched" signal 120, which is obtained from the output of the A/D 128 using the inverse gain (1/G) 152, is then employed to update the coefficients $W_0$ 146 and $W_1$ 148 using a least means squares (LMS) algorithm 154. H(z) 156 is the digital representation of the continuous time (analog) transfer function H(s) 130.

EXAMPLE 21

For a typical motor and corresponding electrical switching apparatus, the range of current that a corresponding current sensor senses, without saturation, is about 0 amperes to about 8 times rated current (amperes). This detects relatively large fault currents and trips the motor when necessary. Alternatively, a different upper value might be employed (e.g., without limitation, between 6 times and 20 times the rated current). This choice directly affects the resolution of the current sensor. For example, if the corresponding A/D converter (ADC) has 12 bits of resolution or 4096 possible output values (counts), and if the rated current is 100 amperes, then for the example of 8 times rated current, the A/D resolution would be 8*100/4096 or about 0.19531 amperes per count. However, for a high resolution current sensor channel (assuming use of the same example ADC), the resolution would be 1*100/4096 or about 0.02441 amperes per count, which provides relatively higher resolution (but with a relatively lower dynamic range).

The example three-phase wellness circuit 6 could be scaled to one (1) times rated current (e.g., without limitation, 100 amperes). If, for example and without limitation, the notch filter gain is 10, and the A/D is a 16-bit converter, then the resolution would be the rated current divided by the notch gain divided by $2^{16}$ or (100/10)/65536=about 0.00015 amperes per count, which provides significantly higher resolution than the previous examples.

Although the disclosed concept includes wellness algorithms 62,64,66,68,70,72 for three-phase AC induction motors, such as the example three-phase motor 4, it is applicable to a wide range of rotating electrical apparatus employing any number of phases.

The disclosed concept can readily be applied to a next generation of base motor control, protection or monitoring products to support a modular motor wellness architecture.

The relatively simple architecture disclosed herein permits wellness to be added in a cost effective manner to a standard base motor control, protection or monitoring unit if no additional external sensors are employed as inputs to the motor wellness module 34. The disclosed motor wellness module 34 provides a relatively low-cost burden on the base three-phase apparatus 32, does not employ any low or medium voltage connections (e.g., without limitation, UL certification is made easier), has a minimal number of customer connection points for ease of installation, and can be used with multiple different base three-phase apparatus without modification. Furthermore, the relatively small footprint (e.g., PCB size) of the motor wellness module 34 enables placement in a variety of packages (e.g., internal; external).

The disclosed concept employs a system architecture that allows for a cost effective way (e.g., lowest base motor control, protection or monitoring unit cost; relatively low cost of the example motor wellness module 34) to add motor diagnostics to a standard motor control, protection or monitoring product. The advantage to a customer is that they can standardize on a base level of motor control, protection or monitoring for all motors and then add relatively more costly motor diagnostics capabilities only to those motors or applications that are considered to be critical.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A system for determining wellness of a three-phase rotating electrical apparatus having a rated current, said system comprising:
    a three-phase electrical switching, control, protection or monitoring apparatus operatively associated with the three-phase rotating electrical apparatus and being structured to provide name plate data, three-phase RMS current, three-phase RMS voltage, percent load, estimated current rotating coordinate system vectors, estimated voltage rotating coordinate system vectors, frequency, and user fault settings thereof; and
    a wellness circuit for the three-phase rotating electrical apparatus, said wellness circuit being separate from the three-phase electrical switching, control, protection or monitoring apparatus, said wellness circuit comprising:
        a current sensor scaled to the rated current and structured to provide a notch current signal representative of one current of three phases of current flowing through said three-phase electrical switching, control, protection or monitoring apparatus,
        an interface to the three-phase electrical switching, control, protection or monitoring apparatus, said interface receiving from the three-phase electrical switching, control, protection or monitoring apparatus the name plate data, the three-phase RMS current, the three-phase RMS voltage, the percent load, the estimated current rotating coordinate system vectors, the estimated voltage rotating coordinate system vectors, the frequency, and the user fault settings, and
        a processor employing the name plate data, the three-phase RMS current, the three-phase RMS voltage, the percent load, the estimated current rotating coordinate system vectors, the estimated voltage rotating coordinate system vectors, the frequency, and the user fault settings and the notch current signal to determine wellness of the three-phase rotating electrical apparatus,
    wherein external interfaces of the wellness circuit are limited to the current sensor and the interface to the three-phase electrical switching, control, protection or monitoring apparatus.

2. The system of claim 1 wherein the three-phase electrical switching, control, protection or monitoring apparatus is selected from the group consisting of a circuit interrupter, a motor starter, a controller, a motor controller, a reduced voltage starter, an inverter drive, a protection device, a relay, a motor protector, an overload relay, and a monitoring device.

3. The system of claim 1 wherein the three-phase electrical switching, control, protection or monitoring apparatus comprises a processor; and wherein the interface is between the last said processor and the processor of the wellness circuit.

4. The system of claim 3 wherein the interface is a Serial Peripheral Interface bus interface.

5. The system of claim 1 wherein the current sensor is selected from the group consisting of a current transducer and a Hall effect current sensor.

6. The system of claim 1 wherein the processor is a digital signal processor.

7. The system of claim 1 wherein the processor comprises an output structured to provide a number of alarms, warnings, cavitation data, motor fault data, bearing fault data, compressed spectrum, frequency, and notch status.

8. The system of claim 7 wherein the three-phase rotating electrical apparatus is a three-phase motor; and wherein the number of alarms are selected from the group consisting of a number of faults of the three-phase motor, a number of rotational faults of the three-phase motor, a number of bearing faults of the three-phase motor, a number of stator faults of the three-phase motor, a number of rotor faults of the three-phase motor, and a number of faults in a load coupled to the three-phase motor.

9. The system of claim 1 wherein a low voltage or a medium voltage is provided to the three-phase rotating electrical apparatus by the three-phase electrical switching, control, protection or monitoring apparatus; and wherein the interface is structured to operate at a logic level voltage which is substantially smaller than the low voltage or the medium voltage.

10. The system of claim 1 wherein the interface is a Serial Peripheral Interface bus interface.

11. The system of claim 1 wherein the wellness circuit is structured to operate with a plurality of different types of the three-phase electrical switching, control, protection or monitoring apparatus.

12. The system of claim 1 wherein the wellness circuit is disposed external to the three-phase electrical switching, control, protection or monitoring apparatus.

13. The system of claim 1 wherein the processor is structured to detect a number of faults of the three-phase rotating electrical apparatus.

14. The system of claim 13 wherein the three-phase rotating electrical apparatus is a three-phase motor; and wherein the number of faults is selected from the group consisting of a number of faults of the three-phase motor, a number of rotational faults of the three-phase motor, a number of bearing faults of the three-phase motor, a number of stator faults of the three-phase motor, a number of rotor faults of the three-phase motor, and a number of faults in a load coupled to the three-phase motor.

15. The system of claim 13 wherein the interface is structured to output the detected number of faults of the three-phase rotating electrical apparatus to the three-phase electrical switching, control, protection or monitoring apparatus.

16. A wellness circuit for a three-phase rotating electrical apparatus operatively associated with a three-phase electrical switching, control, protection or monitoring apparatus being structured to provide name plate data, three-phase RMS current, three-phase RMS voltage, percent load, estimated current rotating coordinate system vectors, estimated voltage rotating coordinate system vectors, frequency, and user fault settings of the three-phase rotating electrical apparatus, said three-phase rotating electrical apparatus having a rated current, said wellness circuit comprising:
a current sensor scaled to the rated current and structured to provide a notch current signal representative of one current of three phases of current flowing through said three-phase electrical switching, control, protection or monitoring apparatus;
an interface to the three-phase electrical switching, control, protection or monitoring apparatus, said interface receiving from the three-phase electrical switching, control, protection or monitoring apparatus the name plate data, the three-phase RMS current, the three-phase RMS voltage, the percent load, the estimated current rotating coordinate system vectors, the estimated voltage rotating coordinate system vectors, the frequency, and the user fault settings; and
a processor employing the name plate data, the three-phase RMS current, the three-phase RMS voltage, the percent load, the estimated current rotating coordinate system vectors, the estimated voltage rotating coordinate system vectors, the frequency, and the user fault settings from the interface and the notch current signal to determine wellness of the three-phase rotating electrical apparatus,
wherein said wellness circuit is structured to be separate from the three-phase electrical switching, control, protection or monitoring apparatus, and
wherein external interfaces of the wellness circuit are limited to the current sensor and the interface to the three-phase electrical switching, control, protection or monitoring apparatus.

17. The wellness circuit of claim 16 wherein the interface is a Serial Peripheral Interface bus interface.

18. The wellness circuit of claim 16 wherein the processor is a digital signal processor.

19. A wellness system comprising:
a three-phase rotating electrical apparatus having a rated current; a three-phase electrical switching, control, protection or monitoring apparatus operatively associated with the three-phase rotating electrical apparatus and being structured to provide name plate data, three-phase RMS current, three-phase RMS voltage, percent load, estimated current rotating coordinate system vectors, estimated voltage rotating coordinate system vectors, frequency, and user fault settings thereof; and
a wellness circuit for the three-phase rotating electrical apparatus, said wellness circuit being separate from the three-phase electrical switching, control, protection or monitoring apparatus, said wellness circuit comprising:
a current sensor scaled to the rated current and structured to provide a notch current signal representative of one current of three phases of current flowing through said three-phase electrical switching, control, protection or monitoring apparatus,
an interface to the three-phase electrical switching, control, protection or monitoring apparatus, said interface receiving from the three-phase electrical switching, control, protection or monitoring apparatus the name plate data, the three-phase RMS current, the three-phase RMS voltage, the percent load, the estimated current rotating coordinate system vectors, the estimated voltage rotating coordinate system vectors, the frequency, and the user fault settings, and
a processor employing the name plate data, the three-phase RMS current, the three-phase RMS voltage, the percent load, the estimated current rotating coordinate system vectors, the estimated voltage rotating coordinate system vectors, the frequency, and the user fault settings from the interface and the notch current signal to determine wellness of the three-phase rotating electrical apparatus,
wherein external interfaces of the wellness circuit are limited to the current sensor and the interface to the three-phase electrical switching, control, protection or monitoring apparatus.

20. The system of claim 19 wherein the three-phase rotating electrical apparatus is a three-phase motor.

21. A method of determining wellness of a three-phase rotating electrical apparatus having a rated current, said method comprising:
operatively associating a three-phase electrical switching, control, protection or monitoring apparatus with the three-phase rotating electrical apparatus;
providing name plate data, three-phase RMS current, three-phase RMS voltage, percent load, estimated current rotating coordinate system vectors, estimated voltage rotating coordinate system vectors, frequency, and user fault settings of the three-phase rotating electrical apparatus with the three-phase electrical switching, control, protection or monitoring apparatus;
providing a wellness circuit for the three-phase rotating electrical apparatus;
providing said wellness circuit separate from the three-phase electrical switching, control, protection or monitoring apparatus;
providing a notch current signal representative of one current of three phases of current flowing through said three-phase electrical switching, control, protection or monitoring apparatus with a current sensor scaled to the rated current;
interfacing the three-phase electrical switching, control, protection or monitoring apparatus to the wellness circuit to receive from the three-phase electrical switching, control, protection or monitoring apparatus the name plate data, the three-phase RMS current, the three-phase RMS voltage, the percent load, the estimated current rotating coordinate system vectors, the estimated voltage rotating coordinate system vectors, the frequency, and the user fault settings thereto;

processing the name plate data, the three-phase RMS current, the three-phase RMS voltage, the percent load, the estimated current rotating coordinate system vectors, the estimated voltage rotating coordinate system vectors, the frequency, and the user fault settings and the notch current signal to determine wellness of the three-phase rotating electrical apparatus; and limiting external interfaces of the wellness circuit to the current sensor and said interfacing the three-phase electrical switching, control, protection or monitoring apparatus to the wellness circuit.

\* \* \* \* \*